United States Patent [19]

Naritake

[11] Patent Number: 6,097,620
[45] Date of Patent: Aug. 1, 2000

[54] MULTI-VALUE DYNAMIC SEMICONDUCTOR MEMORY DEVICE HAVING TWISTED BIT LINE PAIRS

[75] Inventor: Isao Naritake, Tokyo, Japan

[73] Assignee: NEC Corporation, Tokyo, Japan

[21] Appl. No.: 09/195,451

[22] Filed: Nov. 18, 1998

[30] Foreign Application Priority Data

Nov. 19, 1997 [JP] Japan .................................... 9-318774

[51] Int. Cl.[7] .................................................... G11C 5/06
[52] U.S. Cl. .............................. 365/63; 365/51; 365/190; 365/206; 365/168
[58] Field of Search .................................... 365/63, 51, 72, 365/190, 206, 208, 168

[56] References Cited

U.S. PATENT DOCUMENTS

| | | | |
|---|---|---|---|
| 5,475,643 | 12/1995 | Ohta | 365/206 |
| 5,625,585 | 4/1997 | Ahn et al. | 365/63 |
| 5,629,887 | 5/1997 | Nakano et al. | 365/51 |
| 5,949,698 | 9/1999 | Shirley | 365/51 |

FOREIGN PATENT DOCUMENTS

| | | | |
|---|---|---|---|
| 3-16094 | 1/1991 | Japan | G11C 11/56 |
| 9-320280 | 12/1997 | Japan | G11C 11/56 |

*Primary Examiner*—Andrew Q. Tran
*Attorney, Agent, or Firm*—Young & Thompson

[57] ABSTRACT

In a region of a transfer gate provided in a central portion of multilevel writing bit lines, noise in adjacent bit lines at the time of re-writing is counteracted by reversing the order of complementary bit line pair every other pair. With this, in a multilevel dynamic type semiconductor memory device in which one sense amplifier commonly includes a plurality of bit lines and some of the bit lines are selectively activated in a time-dividing manner, the influence of noise between the adjacent bit lines can be deleted.

3 Claims, 12 Drawing Sheets

BLT02 BLN02 BLN03 BLT03 BLT12 BLN12

MULTI-VALUE DYNAMIC SEMICONDUCTOR MEMORY DEVICE HAVING TWISTED BIT LINE PAIRS

BACKGROUND OF THE INVENTION

1. Field of the Invention

The present invention relates to a semiconductor memory device, and more particularly, to a DRAM type semiconductor memory device capable of storing information of a plurality of bits in one memory cell.

2. Description of the Related Art

As a technique for highly integrating a dynamic type semiconductor memory device, Japanese Patent Application Laid-open No. 3-16094 is known. In this prior art, information in an amount of two bits is stored using three elements comprising two transistors and one capacitor, and a memory element structure of 1.5 element per one bit is disclosed.

FIG. 1 shows the conventional semiconductor memory device disclosed in the above publication, and shows memory cells and circuits for reading and writing. FIG. 2 is for showing input waveforms for explaining the operation of FIG. 1. FIGS. 3 and 4 are for showing waveforms when a bit line is read to show the operation of the circuit in FIG. 1.

As shown in FIG. 1, in the memory cell array, a memory cell 20 is a memory cell which accumulates information in an amount of two bits in the two transistors and the one capacitor. Transfer gates 22 and 23 are for reading information in an accumulation capacitor 21, the reference numbers 24 and 25 represent accumulation nodes. The reference numbers 26 and 27 represent sense amplifiers.

Next, with reference to input timing waveforms shown in FIG. 2, the operation of the circuit of the above-described semiconductor memory device will be explained. At a time t0, if bit line equalize control signals NEQ and PEQ are varied as shown in FIG. 2, all transistors in a bit line equalize circuit are turned OFF, a precharge of the bit line is completed, and all voltages becomes ½ Vcc.

Subsequently, as the memory cell 20 is connected to bit line pair BLL1 and $\overline{\text{BLL1}}$ ($\overline{\text{BLL1}}$ is a complementary signal of BLL1), a CUT2 low signal turns off a transistor, which is connected to CUT 2, that is part of a circuit for cutting off the bit line from the sense amplifier, and raises a word line WLL1 at a time t1.

With this operation, information accumulated in the accumulation capacitor 21 is charge transferred to bit lines BLL1, BLR1, SBL1, SBL2 and $\overline{\text{BLL1}}$, $\overline{\text{BLR1}}$, $\overline{\text{SBL1}}$, $\overline{\text{SBL2}}$.

Further, at a time t2, if CUT1 and REQ are low, the bit line on the side of the memory cell is cut off from the sense amplifier, and SBL1 and SBL2 are also cut off from $\overline{\text{SBL1}}$ and $\overline{\text{SBL2}}$, respectively. With this, both the sense amplifiers 26 and 27 are independently provided with the same information as in the memory cell 20.

Then, after UP and DOWN are varied as shown in FIG. 2 at a time t3, sense amplifier action is started by $\overline{\text{SAS}}$ at a time t4, and CUT1 and CUT2 are raised at a time t5 to connect the sense amplifier to a bit line at a side of the memory cell to carry out a pull up by $\overline{\text{SAS}}$.

Finally, CSEL is pulled down at a time t7, the amplified information of the memory cell is transferred to a data line to complete the reading operation.

Since this conventional memory cell accumulates information of two bit in one accumulation capacitor, when the memory cell holds information, there are four kinds of states of voltages of the accumulation nodes 24 and 25 as shown in Table 1 below. Data in the Table shows information which is output to data lines D1 and D2, and H and L correspond to Vcc and GND voltages, respectively.

TABLE 1

| Data | D1 = H<br>D2 = H | D1 = H<br>D2 = L | D1 = L<br>D2 = H | D1 = L<br>D2 = L |
|---|---|---|---|---|
| Node 24 | Vcc | 2/3 Vcc | 1/3 Vcc | GND |
| Node 25 | GND | 1/3 Vcc | 2/3 Vcc | Vcc |

Among them, FIG. 3 shows the state when information of D1=H and D2=H are read out, and FIG. 4 shows the state when information of D1=H and D2=L are read out.

When information of D1=H and D2=H are read out, as shown in FIG. 3, a potential difference of ΔV is generated between the complementary bit lines at the time t1 when the word line is raised as shown in FIG. 3. At the time t3, electric potentials of the SBL1 and $\overline{\text{SBL2}}$ are raised by ⅓ΔV by means of UP and DOWN signals, and electric potentials of $\overline{\text{SBL1}}$ and SBL2 are lowered by ⅓ΔV on the other hand.

However, voltages of the SBL1 and $\overline{\text{SBL1}}$, as well as SBL2 and $\overline{\text{SBL2}}$ are not reversed, and after the sense operation from time t4 onward, Vcc level is output to both the D1 and D2.

On the other hand, when information of D1=H and D2=L are read out, as shown in FIG. 4, at the time t1 when the word line is raised, potential difference of only ⅓ΔV is generated in between the complementary bit lines. Thereupon, at time t3, if potentials of the SBL1 and $\overline{\text{SBL2}}$ are raised by ⅓ΔV by UP and DOWN signals, and potentials of the $\overline{\text{SBL1}}$ and SBL2 are lowered by ⅓ΔV on the other hand, the potentials of the SBL2 and $\overline{\text{SBL2}}$ are reversed. Therefore, after the sense operation from time t4 onward, Vcc is output to D1, and GND level is output to D2.

However, the above described conventional semiconductor memory device is different in a structure of memory array from the both electrodes of the capacitor to a conventional general dynamic RAM having a memory cell comprising one transistor and one capacitor and therefore, their producing methods are also different.

Further, since it is necessary to pull out wires from the complementary bit lines through two transistors, if it is to be highly integrated, it is difficult to layout while maintaining symmetry, and this fact brings out deterioration of margin (reading out margin).

Thereupon, for the purpose of highly integrating a dynamic type semiconductor memory device, the present applicant has already proposed a dynamic type semiconductor memory device capable of accumulating information in an amount two bits in one memory cell even if a conventional memory array comprising one transistor and one capacitor is used (Japanese Patent Application Laid-Open No. 8-352635). Although this senior application has not been opened, there is described a dynamic type semiconductor memory device capable of storing information in an amount of two bits in one memory cell as in the present invention, and this senior application relates to the present invention, the dynamic type semiconductor memory device of the senior application will be first explained.

The semiconductor memory device described in the above-described Japanese Patent Application Laid-Open No. 8-352635 will be explained below with reference to FIGS. 5 to 9. FIG. 5 is a block diagram of a memory cell array and an auxiliary sense amplifier SSA. FIG. 6 is a circuit diagram showing one example of a conventional auxiliary sense amplifier SSA shown in FIG. 5. FIG. 7 shows input timing waveforms for explaining operation of the conventional auxiliary sense amplifier SSA shown in FIG. 6, and FIG. 8 shows bit line operation waveforms at the time of reading out operation for explaining operations of FIGS. 5 and 6.

In FIG. 5, the bit lines are hierarchically layered into a complementary main bit line pair GBLTj, GBLNj and auxiliary bit line pair BLTij and BLNij. One set of main bit lines are connected to one main sense amplifier and a plurality of auxiliary sense amplifiers SSA, which connections are not shown.

With reference to the input timing waveforms shown in FIG. 7, the operation of circuit of the semiconductor memory device shown in FIGS. 5 and 6 will be explained.

As shown in FIG. 7, if PDL which is a precharge control signal of the auxiliary bit line is varied from H level to L level at time t0, all the transistors of the auxiliary bit line precharge circuit shown in FIG. 6 are turned OFF, the precharge in FIG. 6 is completed. Voltages of the auxiliary bit lines SBLTj, SBLNj, BLTij and BLNij remain ½ Vcc. Further, at time t0, transfer gates SG1, SG2 and SG3 vary from H level to L level, and SG0 remains H level. That is, among four auxiliary bit line pair commonly used by one auxiliary sense amplifier, only the auxiliary bit line pair selected at SG0 are first connected to the auxiliary sense amplifier, and reading out and re-writing are carried out.

Next, at time t1, if the word line WL is varied from L level to H level, an information accumulated in the memory cell connected to the word line WL is read out by the auxiliary bit line BLTij all together.

Since the semiconductor memory device shown in FIGS. 5 and 6 accumulates information of two bits in one memory, when the memory cell holds the information, there are four kinds of voltages of the accumulation nodes, i.e., power source voltages Vcc, ⅔ Vcc, ⅓ Vcc and GND (ground potential). These four states respectively correspond to "11", "10", "01" and "00" which are binary numbers of two bits.

At time t1, after the word line is raised, if a potential difference generated between the complementary auxiliary bit line pair when the memory cell holds information "11" is defined as $\Delta V$, a potential difference of $\frac{1}{3}\Delta V$ is generated between the complementary auxiliary bit line pair when the memory cell holds information "10".

FIG. 8 shows an example when memory cells MC02 and MC03 hold information "11" and memory cells MC12 and MC31 hold information "10".

Next, at time t2, if the lead switch signal RS is varied from L level to H level as shown in FIG. 7, readout transistors 3 and 4 of the auxiliary sense amplifier are turned ON, a potential of the main bit line precharged to ½ Vcc by a main bit line precharge circuit which is not shown is lowered in accordance with gate voltages of sense transistors 1 and 2, i.e., in accordance with levels of the auxiliary bit line pair. With this, the potential difference which is read out to the auxiliary bit line is transmitted to the main bit lines GBLT and GBLN.

Next, at time t3, the lead switch signal RS is lowered to L level, the potential difference between the GBLT and GBLN is amplified to Vcc level or GND level by the main sense amplifier as shown in FIG. 8. This represents reading out operation of upper bits, and shows that "H" data is read out to the main bit line pair GBLT3 and GBLN3.

While the main bit line pair are amplified (from time t3 to time t4), since signal CPE for controlling the conduction of transfer gates which are respectively connected in series to the capacitors 5 and 6 between the main bit line and the auxiliary bit line is H level, the potentials of the auxiliary bit line pair receive an influence of variation in potential of the main bit line by the capacitors 5 and 6 of the reading out circuit, and the potentials of the auxiliary bit line pair are also varied.

When the memory cell holds information "11", potentials of the auxiliary bit line BLT02 and BLT03 shown in FIG. 8 are lowered by $\frac{1}{3}\Delta V$, and potentials of BLN02 and BLN03 are raised by $\frac{1}{3}\Delta V$.

Next, at time t4, TGU and CPE are lowered to L level, and the bit line in the memory array and the sense amplifier are cut off and after that, the potential of the auxiliary bit line is not influenced by the variation in potential of the main bit line.

Then, at time 5, a light switch signal WSU is raised, and the amplified potential of the main bit line is written in the auxiliary bit lines BLTij and BLNij.

Thereafter, at time 6, the light switch signal WSU is lowered, and the potential of the main bit line is precharged to ½$\Delta$Vcc.

Next, at time t7, the lead switch signal RS is again activated, and the potential difference between the auxiliary bit lines SBLTj and SBLNj is transmitted to the main bit lines GBLTj and GBLNj and is amplified. At that time, if the memory cell holds information "11", "H" data is again read out, but if the memory cell holds information "10", since the potentials of the SBLTj and SBLNj are reversed as compared with the potentials when upper bits are read out, "L" data is read out. The reading out operation at that time is the reading out operation of lower bits.

Thereafter, at time t9, WSL and TGL are raised as shown in FIG. 7, data in the main bit lines is respectively written in auxiliary bit line pair (not shown) which exist opposite side from the word line WL of the auxiliary sense amplifier SSA. At that time, the auxiliary bit line (not shown) to which lower bit data is written is provided at central portions with multilevel writing transfer gates CTG like the auxiliary bit lines shown in FIG. 5. The transfer gates CTG are turned OFF at that time. Therefore, if the total capacity of the auxiliary bit lines sandwiching the multilevel writing transfer gates CTG is 2 Cb, the upper bit data is written in the auxiliary bit lines having 2 Cb capacity, and the lower bit data is written in the auxiliary bit lines having Cb capacity.

After the light switch signal WSL is raised, if TGU is raised at time t10, four levels are generated on the auxiliary bit line in accordance with data of upper bit and lower bit.

Then, at time t11, SG0 is lowered as shown in FIG. 7, PDL is raised, the auxiliary bit lines SBLTj and SBLNj in the auxiliary sense amplifier are precharged to ½ Vcc and then, SG1 is raised at time t12. Therefore, reading out and re-writing operations of the auxiliary bit line pair selected by SG1 are carried out likewise this time. Then, reading out and re-writing operations of the auxiliary bit line pair selected by SG2 and SG3 are sequentially carried out, and finally, the word line WL is raised to complete the series of reading out operation is completed.

However, in the semiconductor memory device described in the above-described senior application, a capacitance Cbb between adjacent bits exists between the adjacent auxiliary bit lines as shown in FIG. 5. Further, in this conventional semiconductor memory device, at the time of reading out and re-writing operations of the auxiliary bit line pair selected by the transfer gate SG0, the auxiliary bit line pair selected by the adjacent SG1 and SG3 are left reading out data from the memory cell and standing by in a floating state. That is, if the memory cells MC03 and MC13 shown in FIG. 5 store "11" and "10" data, respectively, the word line WL is raised and the transfer gate SG0 is selected, and when data is again written to the auxiliary bit lines BLT03 and BLN03 at time t5 shown in FIG. 8, the auxiliary bit line BLT12 adjacent the auxiliary bit line BLN03 receives a noise from capacitance between adjacent bit lines, and reading out potential difference is reduced as shown in FIG. 8. Further, the bit line BLN31 likewise receives a noise from capacitance between adjacent bit lines from the bit line BLT02, and the reading out potential difference is reduced.

For the reason described above, if a fine working technique is progressed, and a rate of capacitance between adjacent bit lines with respect to bit line parasitic capacitance is increased, there is an undesirable possibility that the reading out margin is deteriorated.

SUMMARY OF THE INVENTION

It is an object of the present invention to provide a multilevel dynamic type semiconductor memory device in which even if a conventional memory cell array comprising one transistor and one capacitor, information in an amount of two bits can be accumulated in one memory cell, and even if the fine working technique is further progressed and a rate of capacity between adjacent bit lines with respect to a bit parasitic capacity is increased, a reading out margin can be secured without being influenced by a noise between the adjacent bit lines.

A dynamic type semiconductor memory device according to the present invention comprises hierarchically layered complementary type main bit lines and auxiliary bit lines; a main sense amplifier connected to the main bit line; a plurality of auxiliary sense amplifiers, each of them being connected to the auxiliary bit lines, and one or some of them being connected to the main bit lines; a first transfer gate provided in a central portion of the auxiliary bit lines for cutting off the auxiliary bit lines into two; a plurality of second transfer gates for connecting the auxiliary bit lines and one of the auxiliary sense amplifier for selectively activating one of the auxiliary bit lines; and a region for changing the order of the complementary auxiliary bit line pair is reversed every other pair in a element region of the first transfer gate.

In the dynamic type semiconductor memory device, the region for changing the order of the complementary auxiliary bit line pair may comprise a diffusion layer of the first transfer gate to which one end of one bit line and the other end of the other bit line are connected, and a bit line wiring layer for connecting the other end of the one bit line and the one end of the other bit line.

According to the present invention, in a multilevel dynamic type semiconductor memory device writing four potential levels in one memory cell, in which one auxiliary sense amplifier commonly includes a plurality of auxiliary bit lines to operate them in a time-dividing manner, it is possible to delete noise due to capacity between adjacent bit lines without increasing a chip area, and to enhance the operation margin. Further, according to the present invention, when the order of bit lines is reversed, it is possible to use the diffusion layer portion of the multilevel writing transfer gate and therefore, it is unnecessary to specially provide a wiring layer.

DESCRIPTION OF THE PREFERRED EMBODIMENT

Figure 10:
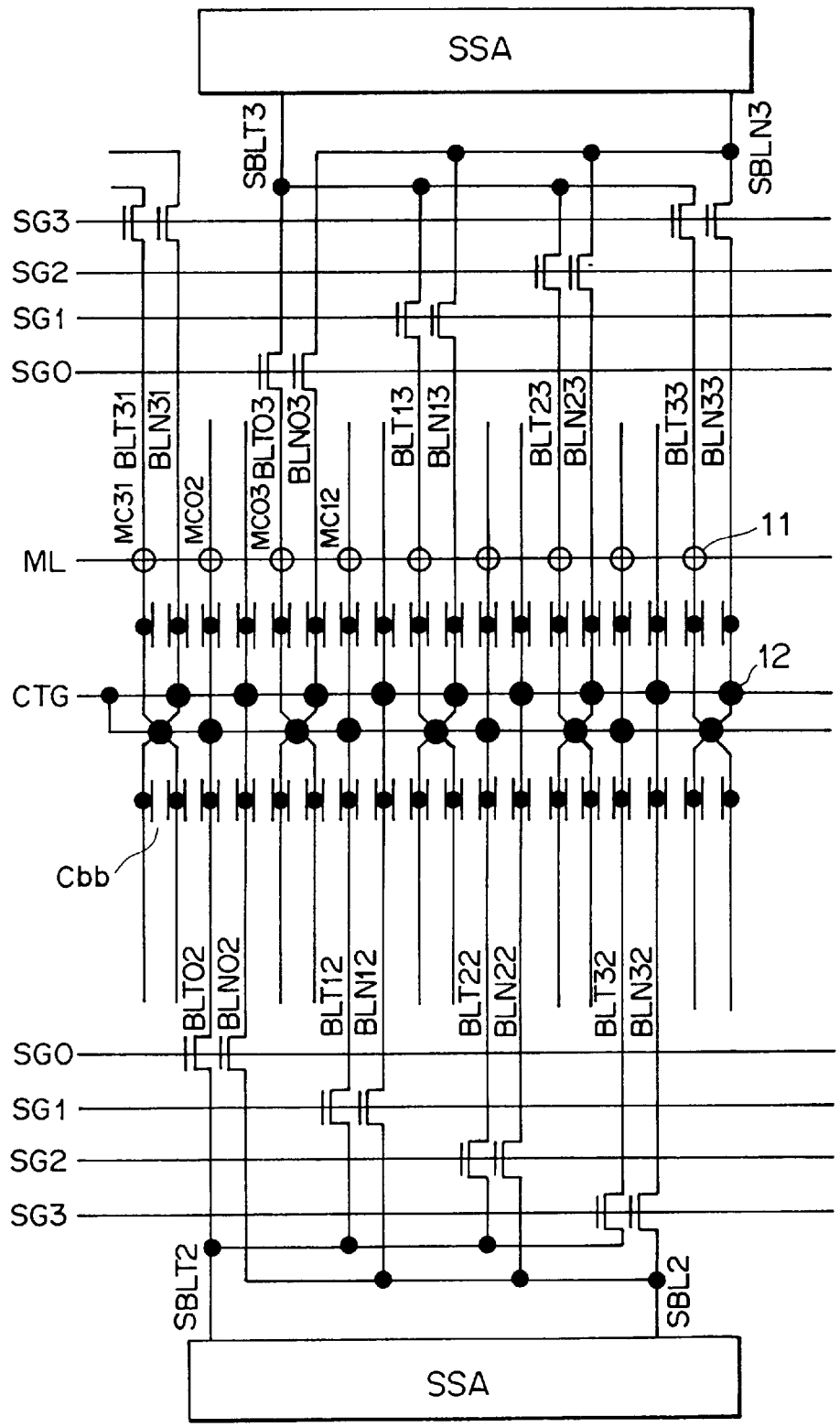
FIG. 10 is a circuit diagram showing a structure of the dynamic type semiconductor memory device of the embodiment of the present invention.

A preferred embodiment of the present invention will be concretely explained below with reference to the accompanying drawings. FIG. 10 is block diagram showing a memory cell array of a dynamic type semiconductor memory device and auxiliary sense amplifier SSA of the embodiment of the present invention. In FIG. 10, a multilevel writing transfer gate exists in a central portion of auxiliary bit lines for dividing bit parasitic capacitance of the auxiliary bit lines in a ratio of one to one, and is required to generate four value writing levels in a four value dynamic type semiconductor memory device.

Figure 5:
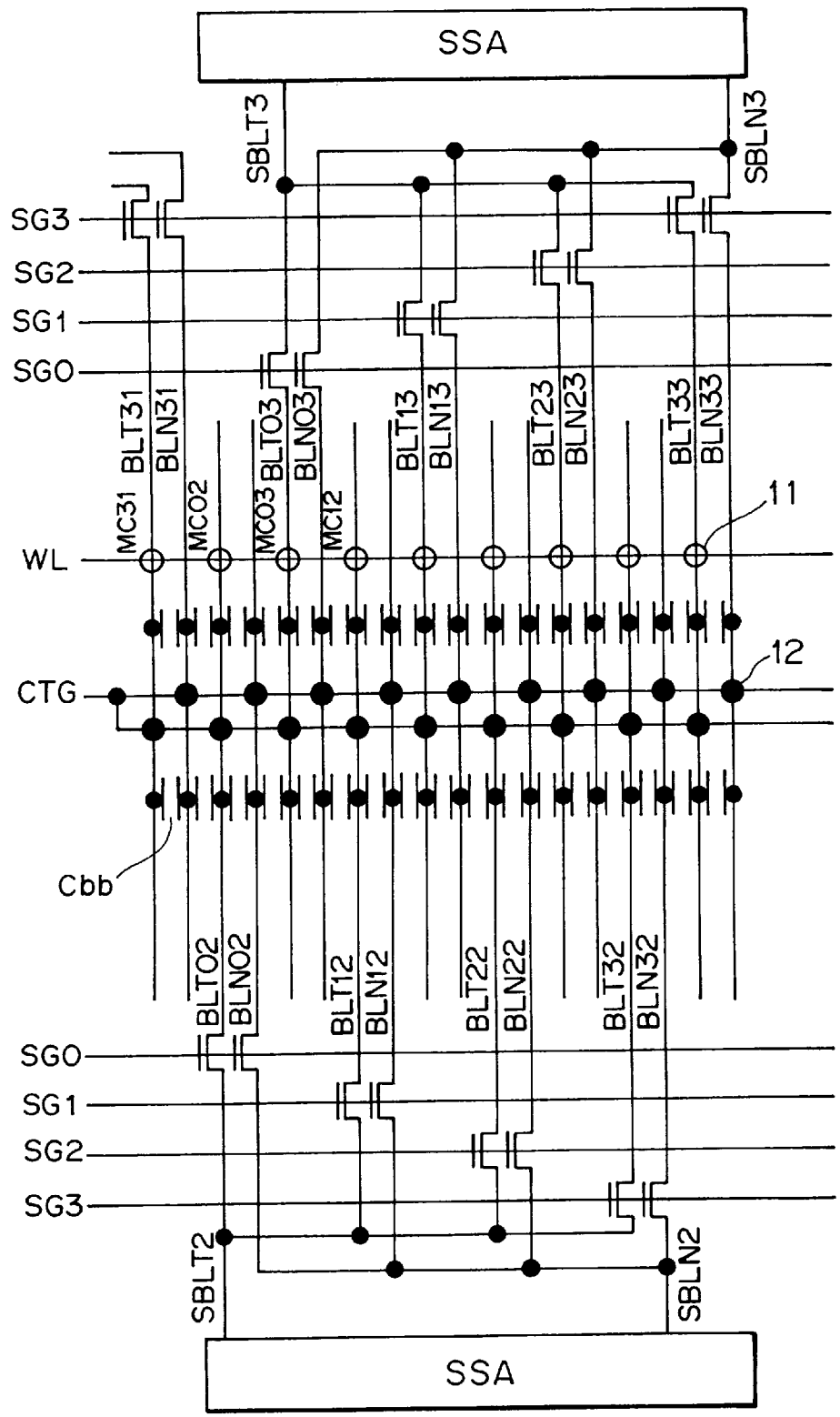
FIG. 5 is a circuit diagram showing a structure of a dynamic type semiconductor memory device of a senior application.

A structure of the embodiment of the present invention shown in FIG. 10 is different from a structure of the senior application shown in FIG. 5 in a portion of the multilevel writing transfer gate. In the structure of the embodiment of the present invention shown in FIG. 10, the order of auxiliary bit line pair is reversed every other pair as shown in FIG. 10.

Figure 9:
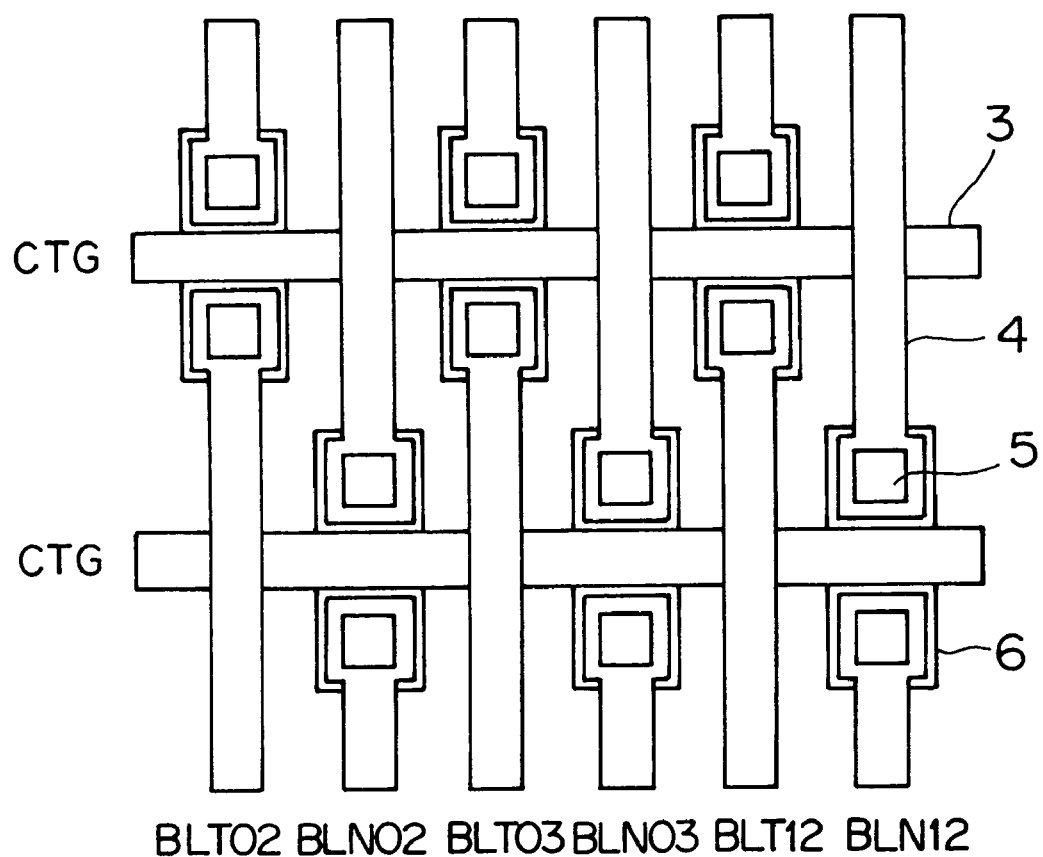
FIG. 9 is a diagram of mask layout of the senior application.

FIG. 9 shows one example of a mask layout pattern of a multilevel writing transfer gate having the conventional structure shown in FIG. 5. Vertically extending wires indicate bit wiring layers 4, and laterally extending wires indicate gate wiring layers 3 of transfer gate control signal CTG. Squares indicate contact holes 5 for connecting the bit wiring layers 4 and diffusion layers 6, and rectangles indicate regions of n⁺ diffusion layers 6 forming an nMOS transistor. Since memory cells of the dynamic type semiconductor memory device are disposed using a minimum design rule, multilevel writing transfer gates cannot be disposed in one row and thus, they are disposed in two rows alternately as shown in FIG. 9.

Figure 11:
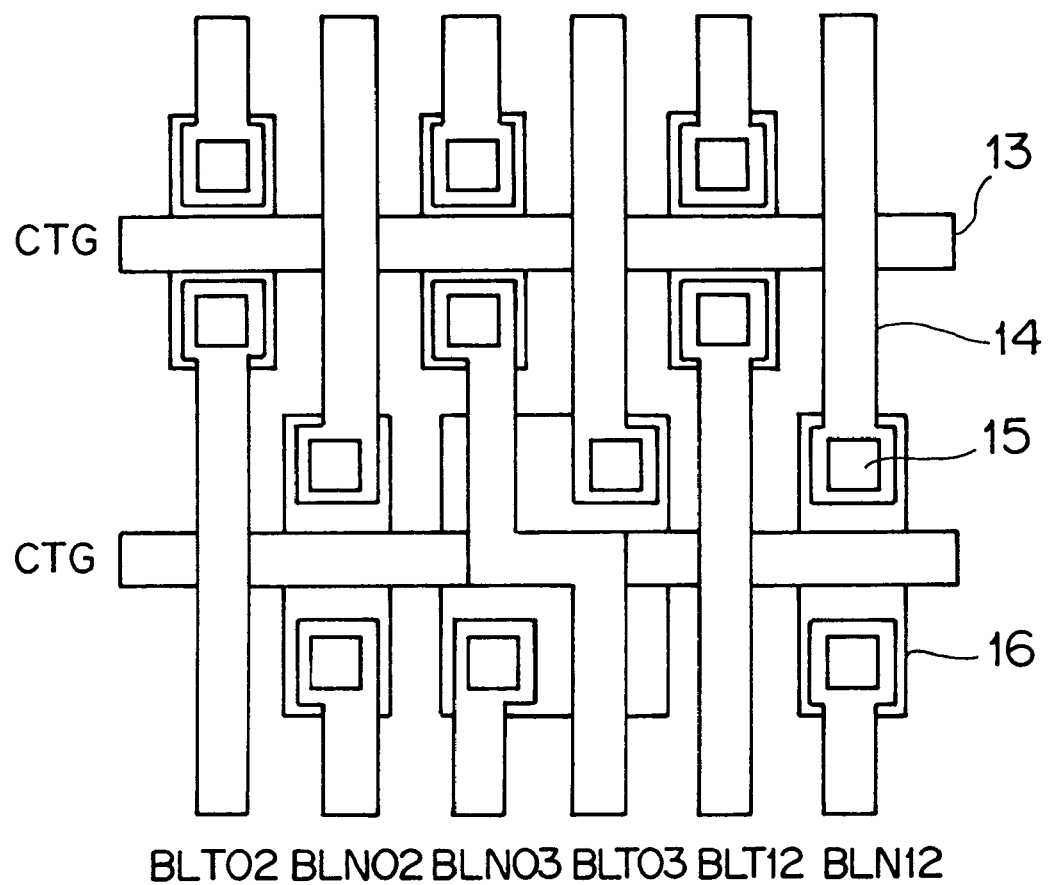
FIG. 11 is a diagram of mask layout of the embodiment of the present invention.

FIG. 11 shows one example of a mask layout pattern of a multilevel writing transfer gate having the structure of the embodiment of the present invention shown in FIG. 10. The wiring layers 13 and 14 are formed in the same manner as that shown in FIG. 9. As shown in FIG. 11, the wire of the bit wiring layer 14 of an auxiliary bit line BLN03 is partially cut in a region of the multilevel writing transfer gate. Utilizing this region, the order of the BLT03 and BLN03 can be reversed as shown in FIG. 11. At that time, the area is not increased almost at all as compared with the multilevel writing transfer gate having the structure of the senior application shown in FIG. 9.

Figure 12:
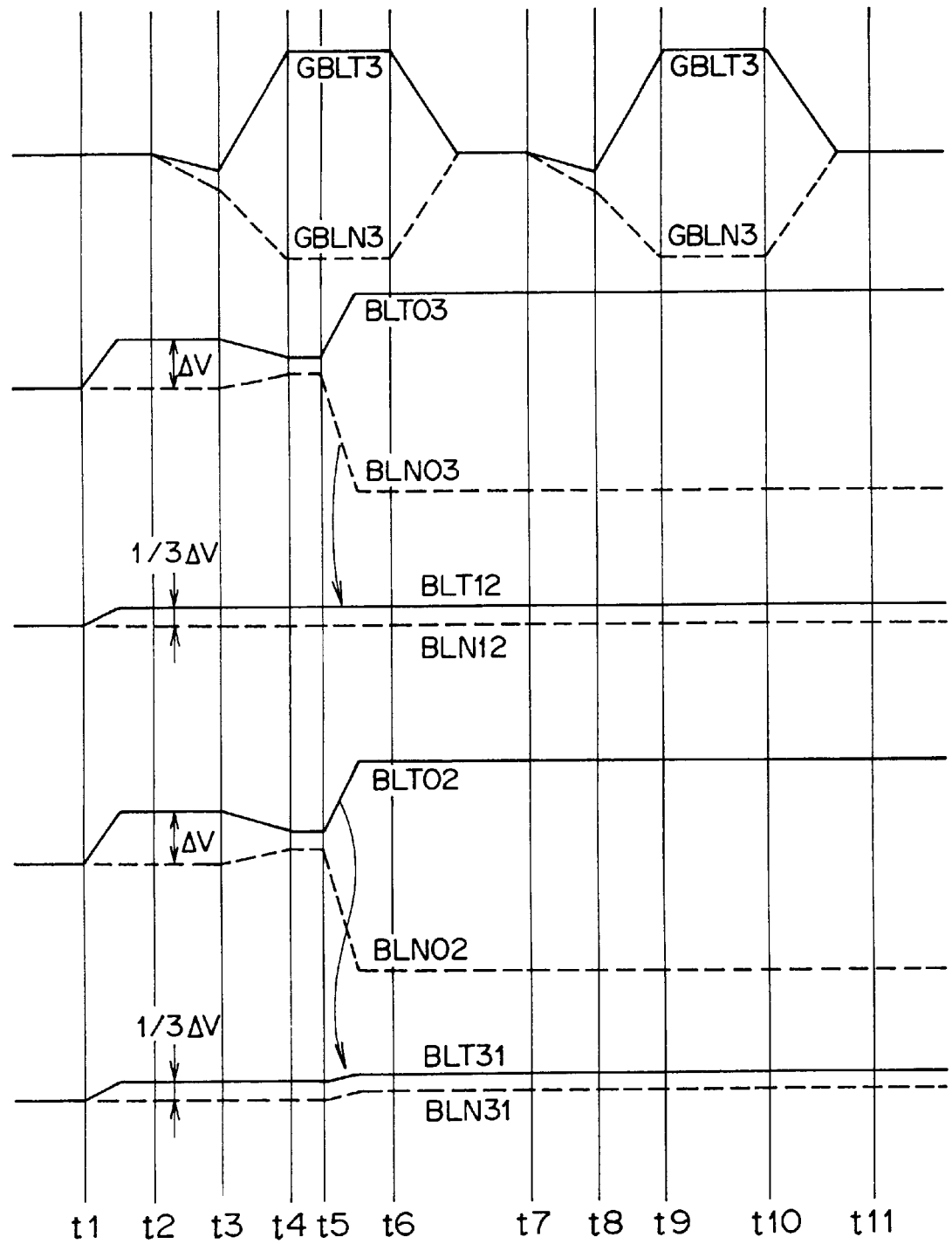
FIG. 12 is a diagram of bit line operating waveforms at the time of reading out of the embodiment of the present invention.

FIG. 12 shows bit line operation waveforms at the time of reading out operation for explaining the operation of the embodiment of the present invention shown in FIG. 10.

Figure 6:
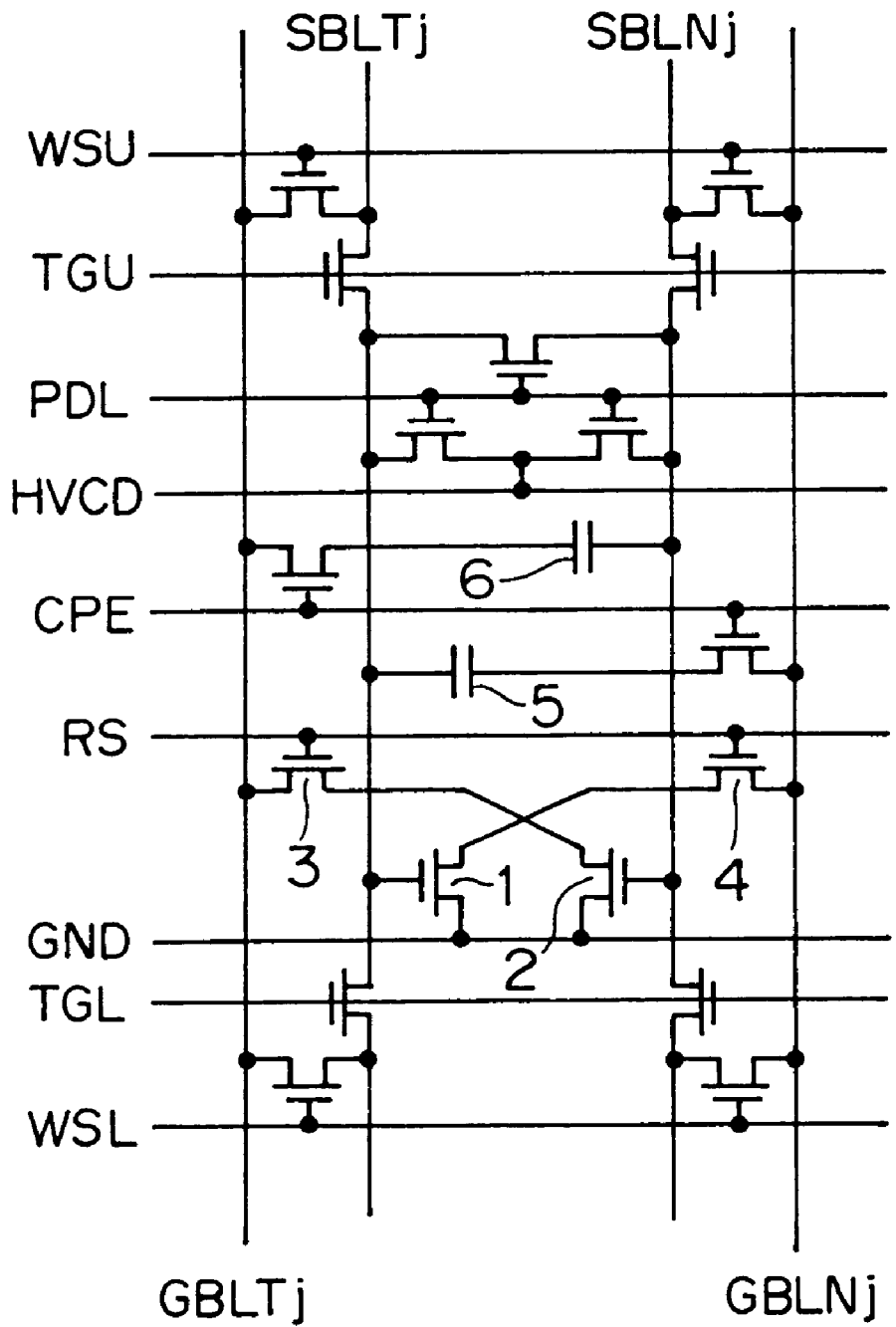
FIG. 6 is a circuit diagram of an auxiliary sense amplifier showing a structure of embodiments of the senior application.

A circuit diagram of the auxiliary sense amplifier SSA having the structure of the embodiment of the present invention is the same as a circuit diagram showing one example of the auxiliary sense amplifier SSA of the senior application shown in FIG. 6 for example. Input timing waveforms are also the same as those of the auxiliary sense amplifier SSA of the senior application shown in FIG. 7.

Figure 7:
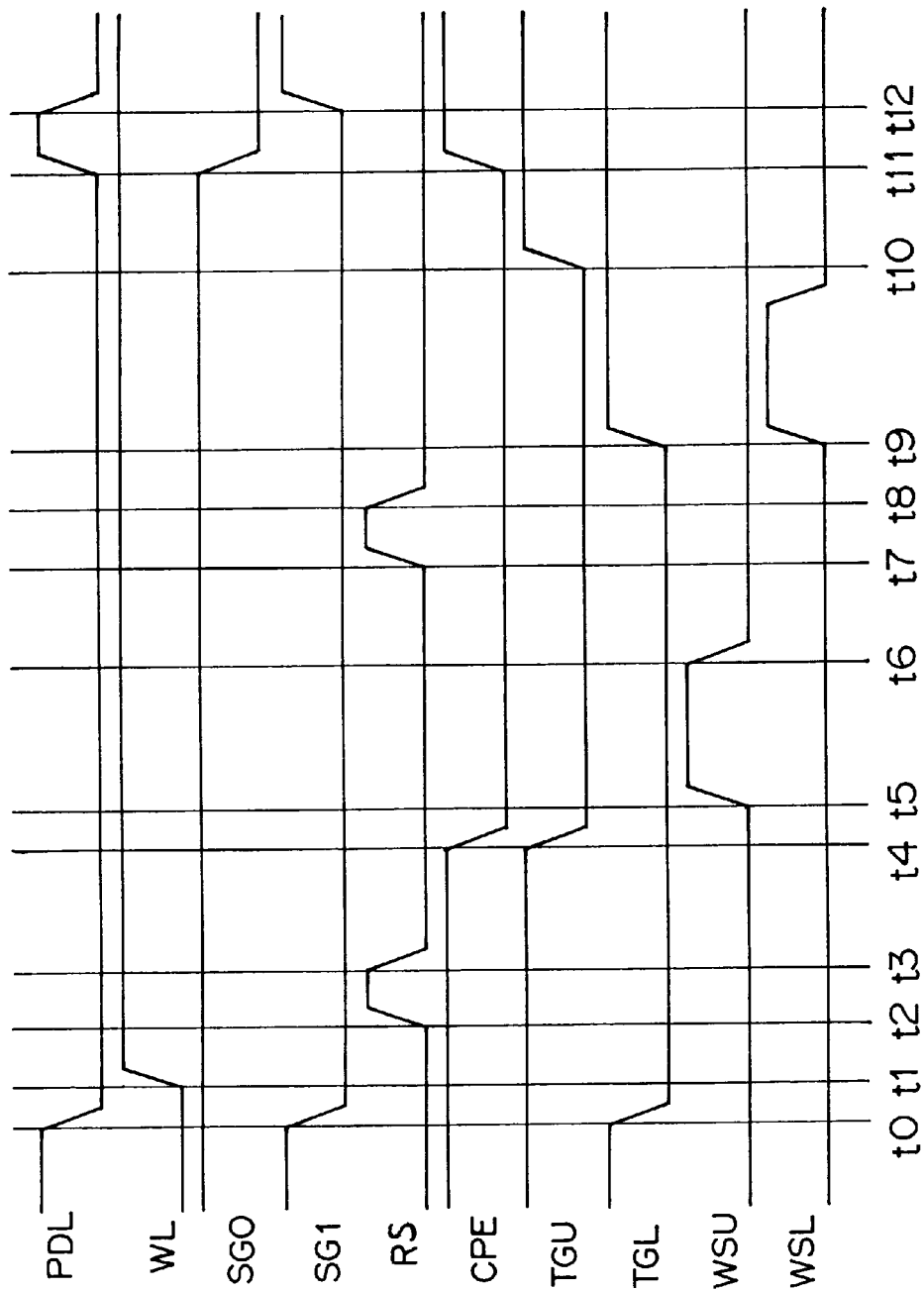
FIG. 7 is a diagram of input timing waveforms of the senior application.
Figure 8:
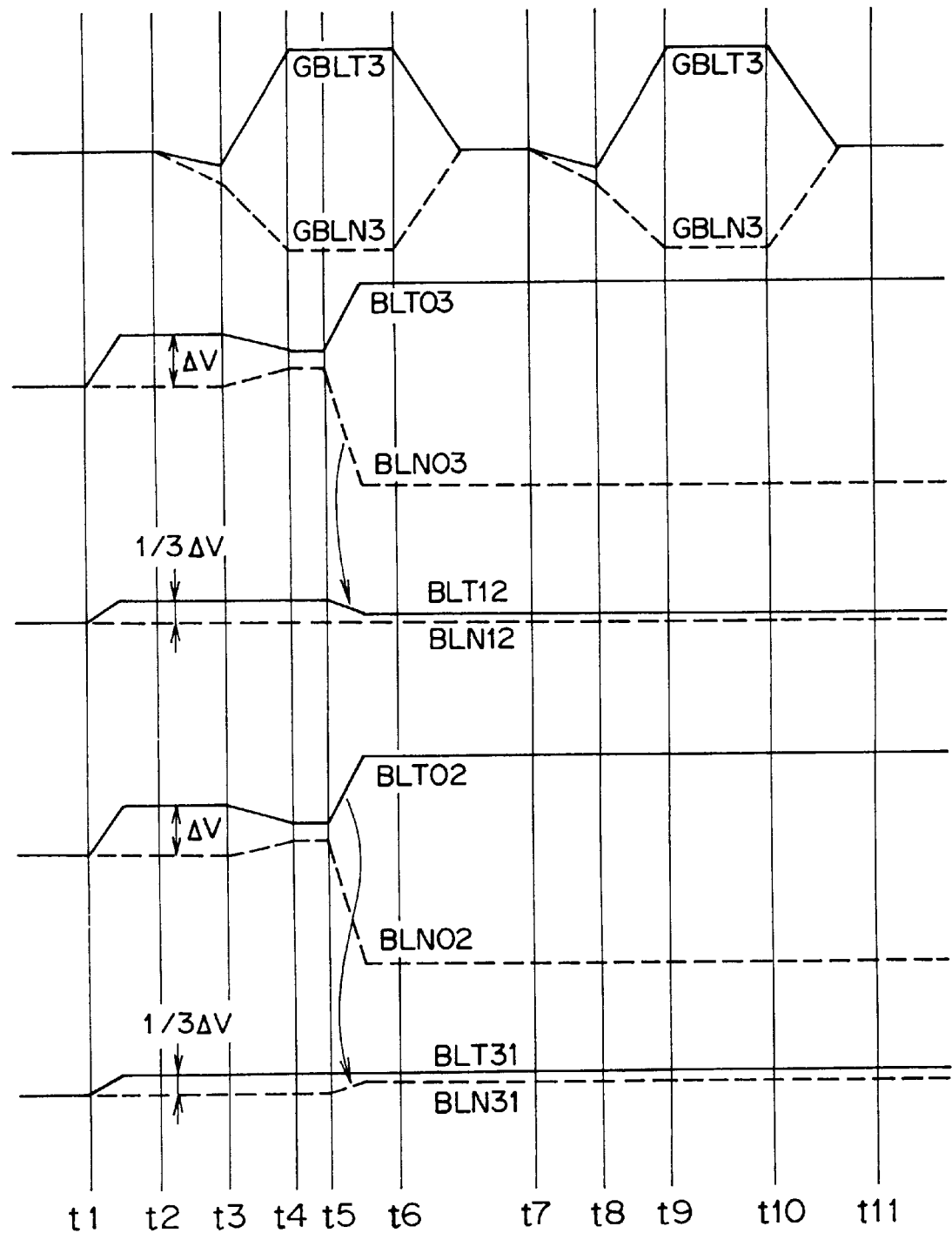
FIG. 8 is a diagram of bit line operating waveforms at the time of reading out of the senior application.

The operation of the circuit of the embodiment of the present invention shown in FIG. 10 will be explained with reference to the input timing waveforms shown in FIG. 7 and the bit line operation waveforms at the time of reading out operation shown in FIG. 12.

Similar to the explanation of the circuit operation of the senior application, reading out and re-writing operations of data in memory cells MC02 and MC03 connected to auxiliary bit line pairs BLT02, BLN02 and BLT03, BLN03 selected by a transfer gate signal SG0 will be explained.

Figure 3:
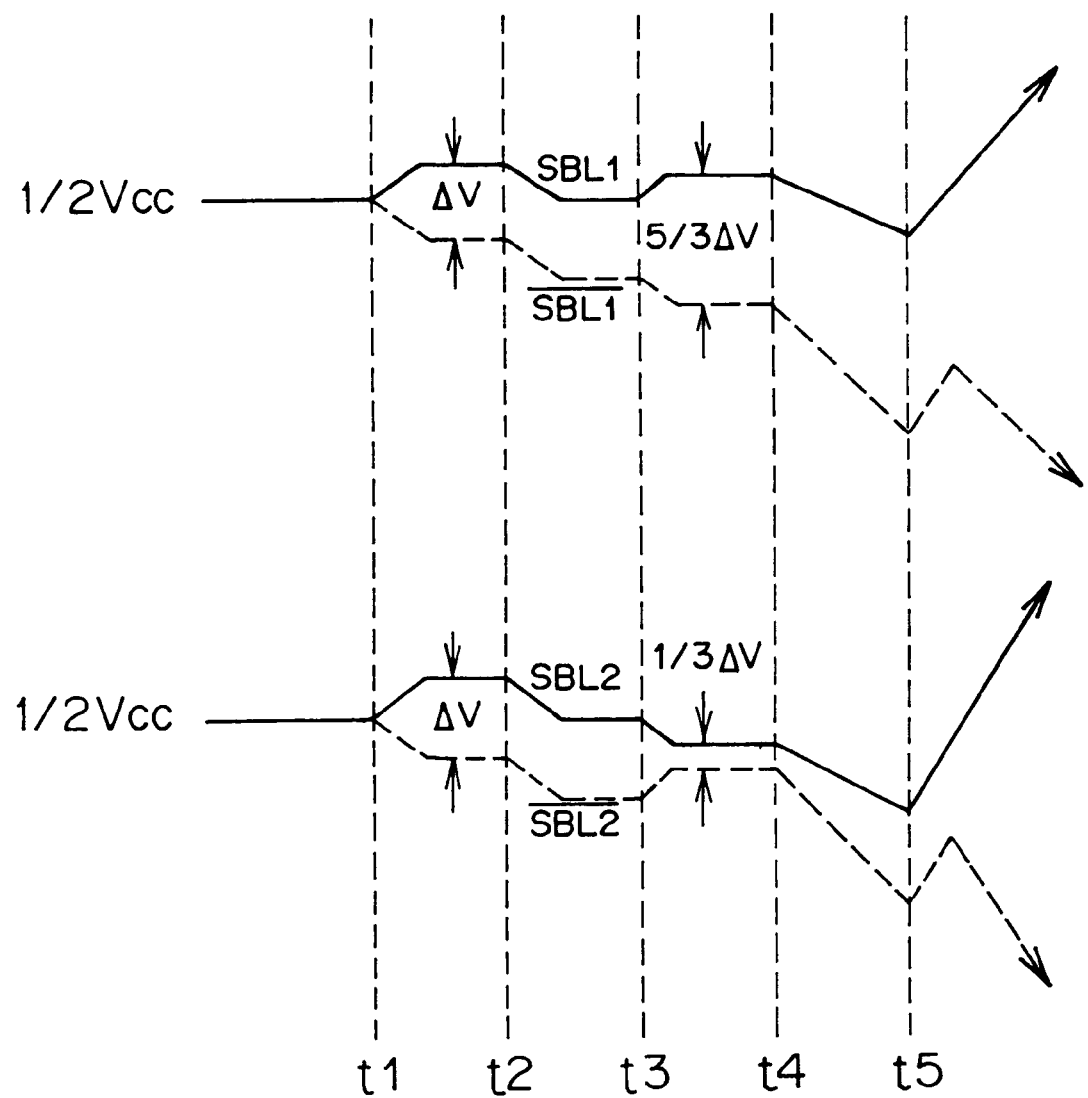
FIG. 3 is a diagram of bit line reading out waveforms of the conventional semiconductor memory device.
Figure 4:
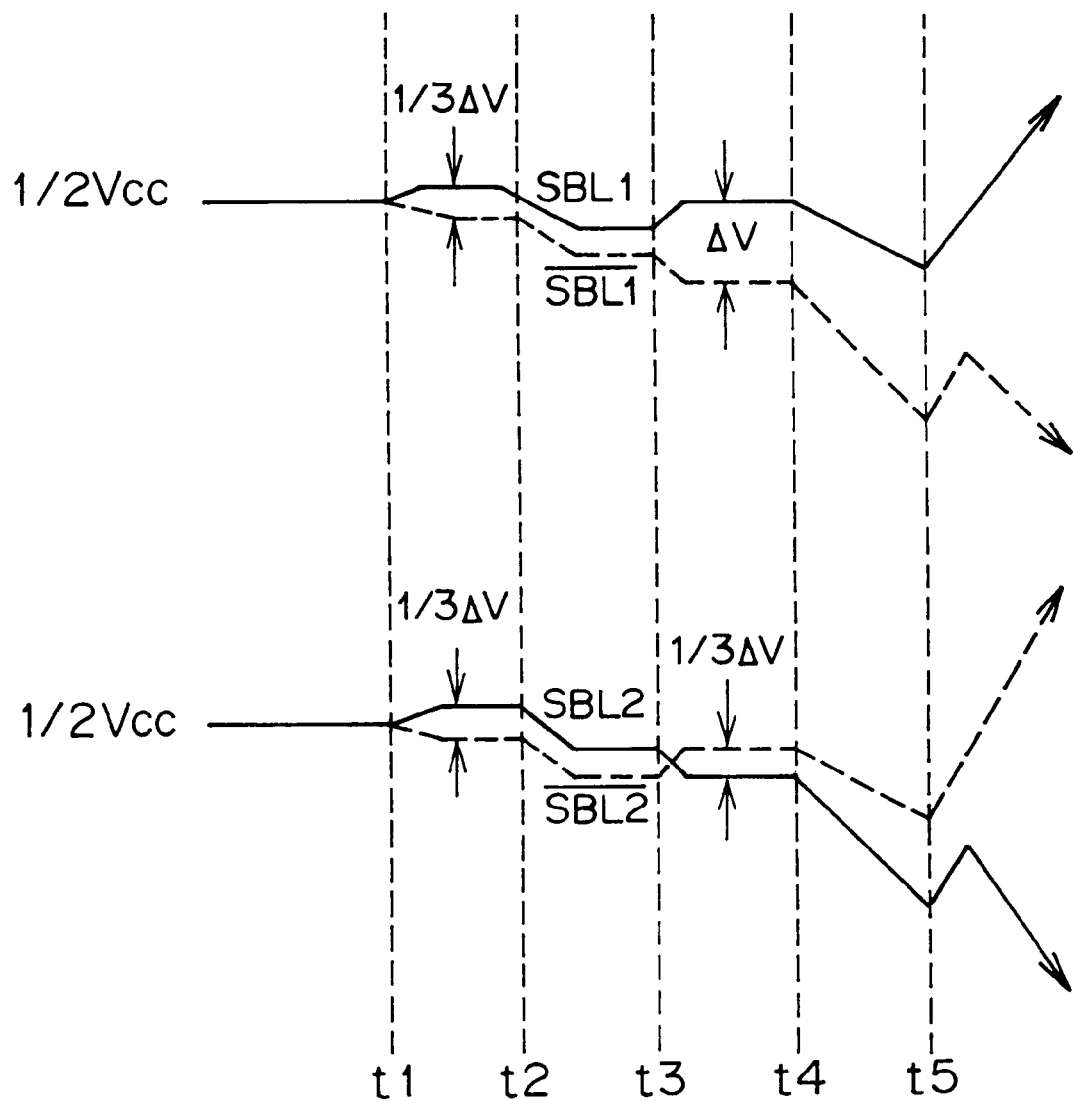
FIG. 4 is a diagram of bit line reading out waveforms of the conventional semiconductor memory device.

When the memory cell MC03 holds two bit information "11" and the memory cell MC12 holds two bit information "10", if a light switch signal WSU raises at time t5, the amplified potential of a main bit line is written in the auxiliary bit lines BLT03 and BLN03 as shown in FIG. 12. At that time, an auxiliary bit BLT12 adjacent the auxiliary bit line pair BLT03 and BLN03 is left reading out data from the memory cell MC12 and standing by in a floating state. Therefore, the auxiliary bit BLT12 receives a noise due to the capacitance between the adjacent bit lines between the auxiliary bit line pair BLT03 and BLN03. However, since the order of the auxiliary bit line pair BLT03 and BLN03 is reversed in their intermediate portions, the upper half of the auxiliary bit line BLT12 shown in FIG. 10 receives a noise in a negative direction from BLN03, and the lower half of the auxiliary bit line BLT12 shown in FIG. 10 receives a noise in a positive direction from BLT03. As a result, these noises are counteracted and deleted, the potential of the auxiliary bit line BLT12 is not varied as shown in FIG. 3.

Figure 1:
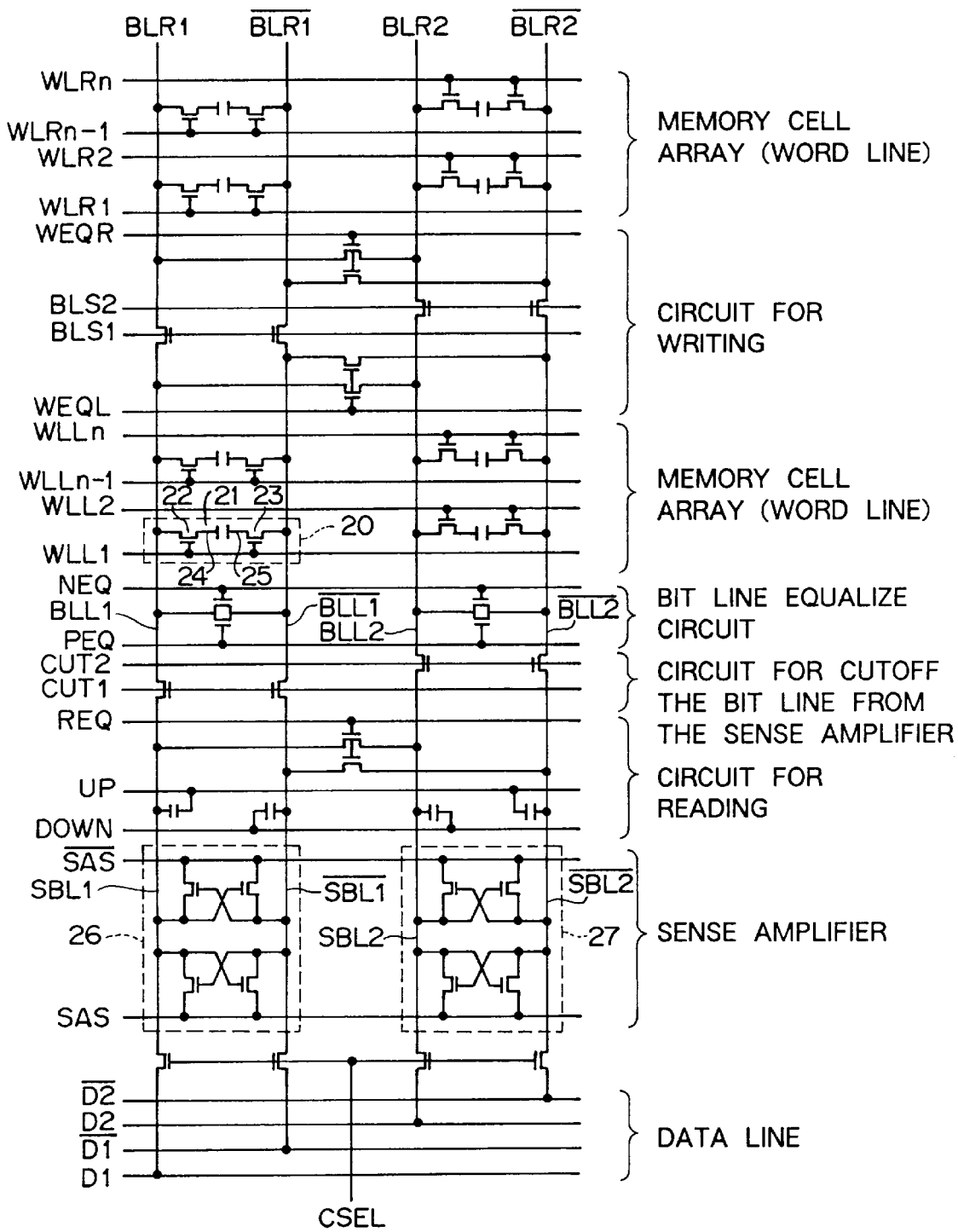
FIG. 1 is a circuit diagram showing a conventional semiconductor memory device.
Figure 2:
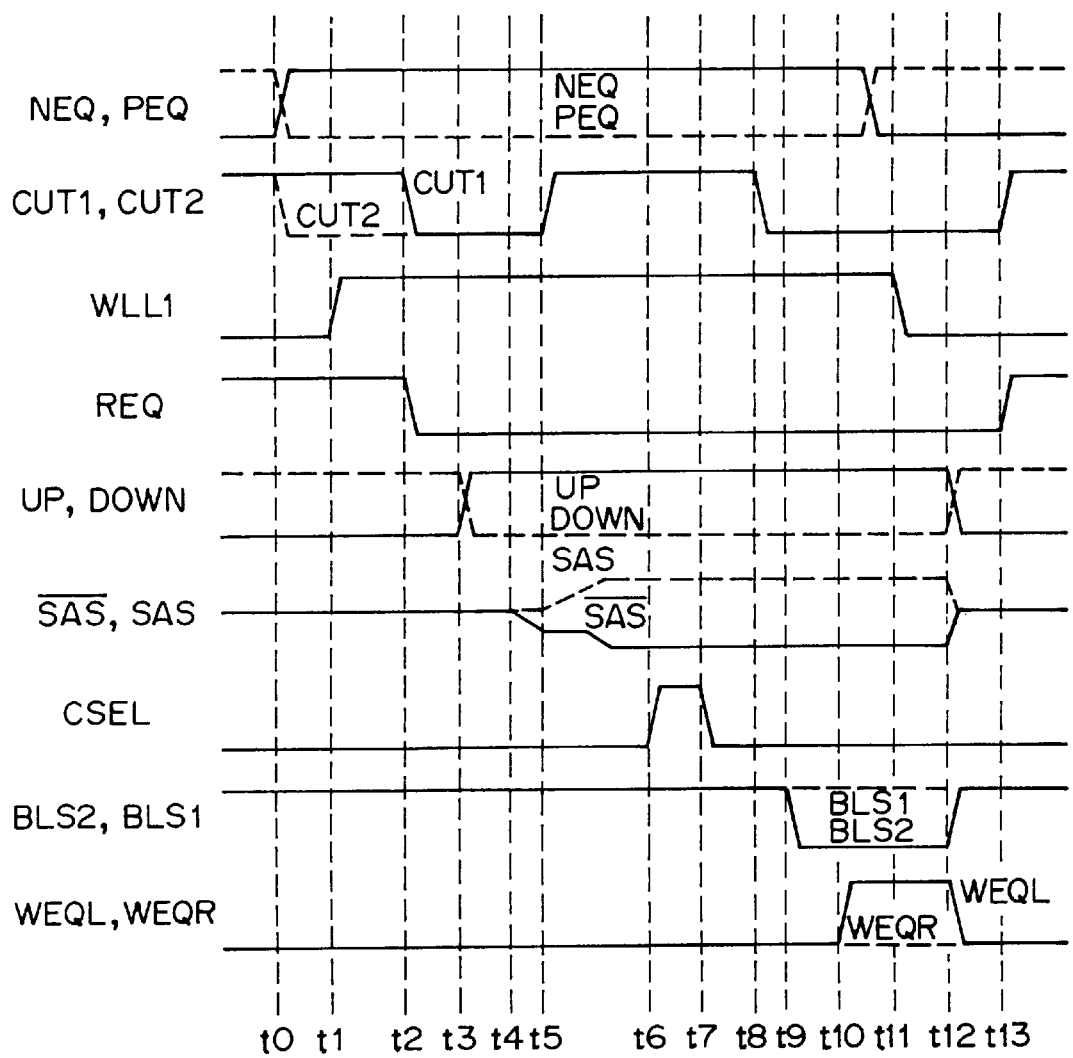
FIG. 2 is a diagram of input timing waveforms of the conventional semiconductor memory device.

Similarly, when the memory cell MC02 holds two bit information "11" and the memory cell MC31 holds two bit information "10", if the light switch signal WSU raises at time t5, the amplified potential of the main bit line is written in the auxiliary bit lines BLT02 and BLN02 as shown in FIG. 12. At that time, an auxiliary bit BLT31 adjacent to the auxiliary bit line pair BLT02 is left reading out data from the memory cell MC31 and standing by in floating state, and the auxiliary bit line BLN31 is kept at ½ Vcc level and standing by in floating state. Therefore, these auxiliary bit BLT31 and BLN31 receive noises due to the capacitance between the adjacent bit lines between the auxiliary bit line BLT02. However, since the order of the auxiliary bit line pair BLT31 and BLN31 is reversed in their intermediate portions, the lower half of the auxiliary bit line BLT31 shown in FIG. 1 receives a noise in a positive direction from BLN02, and the upper half of the auxiliary bit line BLT02 shown in FIG. 1 receives a noise of the same level also in the positive from BLT02. As a result, the potentials of the auxiliary bit lines BLT31 and BLN31 are slightly increased while keeping the potential difference as it is.

What is claimed is:

1. A dynamic semiconductor memory device, comprising:

auxiliary bit lines that are arranged in plural pairs, said plural pairs being arrayed adjacent to one another;

a plurality of auxiliary sense amplifiers coupled to respective ones of said auxiliary bit lines; and a transfer gate traversing said plural pairs of auxiliary bit lines for selectively activating said auxiliary bit lines, the auxiliary bit lines in a first pair of said plural pairs of auxiliary bit lines reversing their order adjacent to said transfer gate, and the auxiliary bit lines in second and third pairs of said plural pairs of auxiliary bit lines that are directly adjacent to said first pair on either side thereof not reversing their order adjacent to said transfer gate.

2. The device of claim 1, further comprising a diffusion layer that is selectively activated by said transfer gate, one auxiliary bit line of said first pair being connected to said diffusion layer on both sides of said transfer gate so as to be selectively activated by said transfer gate, the other auxiliary bit line of said first pair crossing said transfer gate and crossing said diffusion layer between connections of said one auxiliary bit line thereto so as to reverse the order of the two auxiliary bit lines in said first pair adjacent to said transfer gate.

3. The device of claim 1, further comprising a further transfer gate that traverses said plural pairs of auxiliary bit lines and a further diffusion layer to which the other auxiliary bit line of said first pair is connected, said further diffusion layer being selectively activated by said further transfer gate to selectively activate the other auxiliary bit line of said first pair.

* * * * *